United States Patent
Ryan et al.

(10) Patent No.: US 8,980,740 B2
(45) Date of Patent: Mar. 17, 2015

(54) BARRIER LAYER CONFORMALITY IN COPPER INTERCONNECTS

(71) Applicant: GLOBALFOUNDRIES Inc., Grand Cayman, KY (US)

(72) Inventors: Errol Todd Ryan, Clifton Park, NY (US); Xunyuan Zhang, Albany, NY (US)

(73) Assignee: GLOBALFOUNDRIES Inc., Cayman Islands ( * ) Notice: Subject to any disclaimer, the term of this patent is extended or adjusted under 35 U.S.C. 154(b) by 0 days.

(21) Appl. No.: 13/786,627

(22) Filed: Mar. 6, 2013

(65) Prior Publication Data

US 2014/0252617 A1    Sep. 11, 2014

(51) Int. Cl.
*H01L 21/4763* (2006.01)
*H01L 21/768* (2006.01)

(52) U.S. Cl.
CPC ... *H01L 21/76843* (2013.01); *H01L 2924/0002* (2013.01)
USPC .......................................................... 438/639

(58) Field of Classification Search
CPC ..................... H01L 21/7687; H01L 21/76805; H01L 21/76802
USPC .......... 438/627, 629, 637, 639, 672, 675, 687
See application file for complete search history.

(56) References Cited

U.S. PATENT DOCUMENTS

| | | | |
|---|---|---|---|
| 6,051,321 A | 4/2000 | Lee et al. | |
| 6,171,979 B1 | 1/2001 | Aoi | |
| 6,184,407 B1 | 2/2001 | Yoshitake et al. | |
| 6,218,303 B1 | 4/2001 | Lin | |
| 6,355,571 B1 | 3/2002 | Huang et al. | |
| 6,358,838 B2 | 3/2002 | Furusawa et al. | |
| 6,531,621 B1 | 3/2003 | Dorsch et al. | |
| 6,663,973 B1 | 12/2003 | Lee et al. | |
| 6,680,541 B2 | 1/2004 | Furusawa et al. | |
| 6,734,102 B2 | 5/2004 | Rathi et al. | |
| 6,777,325 B2 | 8/2004 | Ryuzaki et al. | |
| 6,803,314 B2 | 10/2004 | Quek et al. | |
| 6,919,636 B1 | 7/2005 | Ryan | |
| 6,953,742 B2 | 10/2005 | Chen et al. | |
| 7,557,035 B1 | 7/2009 | Ryan et al. | |
| 7,998,856 B2 | 8/2011 | Ryan | |
| 2001/0009295 A1 | 7/2001 | Furusawa et al. | |
| 2002/0105085 A1 | 8/2002 | Furusawa et al. | |
| 2004/0094839 A1 | 5/2004 | Fitzsimmons et al. | |
| 2004/0224494 A1 | 11/2004 | Clevenger et al. | |
| 2005/0023689 A1 | 2/2005 | Nicholson et al. | |
| 2005/0208758 A1* | 9/2005 | Lu et al. | 438/623 |
| 2005/0208760 A1* | 9/2005 | Ryan | 438/639 |
| 2008/0081464 A1* | 4/2008 | Matsuda et al. | 438/660 |
| 2008/0157379 A1* | 7/2008 | Choi | 257/751 |
| 2010/0102435 A1 | 4/2010 | Ryan et al. | |
| 2010/0122711 A1 | 5/2010 | Ryan | |
| 2010/0304566 A1 | 12/2010 | Fischer et al. | |
| 2012/0049383 A1 | 3/2012 | Schaller et al. | |
| 2012/0326312 A1* | 12/2012 | JangJian et al. | 257/751 |

* cited by examiner

*Primary Examiner* — Brook Kebede
(74) *Attorney, Agent, or Firm* — Heslin, Rothenberg, Farley & Mesiti, P.C.

(57) ABSTRACT

A process of modulating the thickness of a barrier layer deposited on the sidewalls and floor of a recessed feature in a semiconductor substrate is disclosed. The process includes altering the surface of the conductive feature on which the barrier layer is deposited by annealing in a reducing atmosphere and optionally additionally, silylating the dielectric surface that forms the sidewalls of the recessed feature.

11 Claims, 1 Drawing Sheet

BARRIER LAYER CONFORMALITY IN COPPER INTERCONNECTS

FIELD OF THE INVENTION

The present invention relates to semiconductor devices and process of fabricating semiconductor devices, and more particularly, to a process of fabricating semiconductor devices with barrier layers.

BACKGROUND OF THE INVENTION

Copper has lower bulk resistivity and potentially higher electromigration tolerance than aluminum and so, is considered as a viable alternative for metallization patterns, particularly for integrated circuits with smaller features. However copper has a high mobility and can diffuse easily through the interlayer dielectric materials, such as low-k or ultra low k dielectrics, commonly used in integrated circuits. This diffusion or drift of copper through the various layers can cause degradation in the performance of the device. In addition under the influence of current flow, copper migrates within the metallization and vias creating voids and dendrites when the Blech length is exceeded.

Consequently, a diffusion barrier layer that has a high thermal stability, low resistivity and a low copper diffusion constant is used to overcome the diffusion and electromigration problems. Traditionally, some of the diffusion barrier materials used are tantalum nitride (TaN), tantalum (Ta) and titanium nitride (TiN) which are deposited using conventional deposition processes such as physical vapor deposition (PVD) process, chemical vapor deposition (CVD) and atomic layer deposition (ALD). The thickness of the diffusion barrier layer over the interlayer dielectric must be sufficient to limit the diffusion of copper into the surrounding inter layer dielectric materials and over the metallization must be sufficient to eliminate the critical electromigration effect.

Accordingly, a need exists for a process to modulate the thickness of deposition of a barrier layer on the walls and floor of recessed feature.

BRIEF SUMMARY OF THE INVENTION

The shortcomings of the prior art are overcome and additional advantages are provided through the provision, in one aspect, of a process which includes, for instance; providing a substrate having both an exposed dielectric surface and an exposed metal surface; exposing metal surface to a reducing agent, or exposing both metal surface to a reducing agent and the dielectric surface to a reactive silane; and depositing a barrier layer over the exposed metal surface.

In a further aspect, a semiconductor device is provided which includes a semiconductor substrate; a conductive feature substantially planar with a surface of the substrate; a dielectric material overlying at least a portion of the substrate adjacent the conductive feature, and not overlying at least a portion of the conductive feature; a barrier layer conformally covering, and in direct contact with, at least a portion of the conductive feature and at least a portion of the dielectric; wherein the thickness of the barrier layer is the same or greater over said conductive feature than over the dielectric material.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
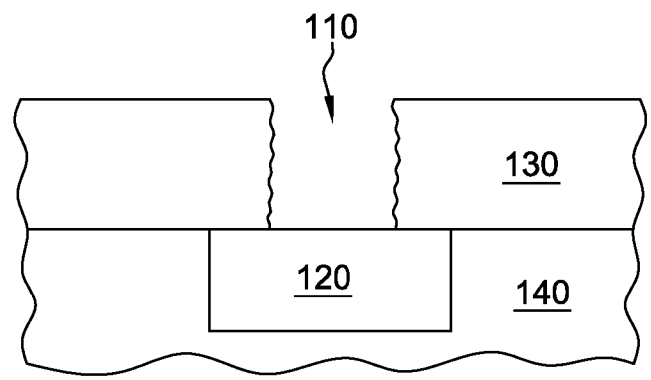
FIG. 1 depicts a cross-section of a device according to one embodiment of the invention.

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure.

Reference is made below to the drawings, which are not drawn to scale for ease of understanding, wherein the same reference numbers used throughout different figures designate the same or similar components.

A problem with conventional processes for providing a barrier layer in sub-micron trenches is that the thickness of the barrier layer deposited on the walls and the floor of the recessed feature varies in a disadvantageous manner. For example, a thinner barrier layer is often deposited on the floor of the recessed feature than in the walls. However, it is often desirable to provide a barrier layer with uniform thickness or even with thinner walls and thicker floor on the recessed feature, to eliminate electromigration effects. Typically, the barrier layers include, but are not limited to, ruthenium (Ru), an alloy of ruthenium, cobalt (Co), manganese nitride (MnN), tantalum based materials (e.g., TaN, TaC, TaCN, TaSiN), titanium based materials (e.g., TiN, TiCN, TiSiN), tungsten based materials (e.g., WN, WC, WCN) or a combination thereof.

The present invention relates to a method for, modulating the thickness of a barrier layer deposited on the walls and the floor of the recessed feature, which in one example may be a trench, by exposing the metal surface that forms the floor to a reducing agent. The thickness may be further modulated by silylating the dielectric surface that forms the walls of the recessed feature.

In accordance with the embodiments of the present invention, the thickness of the barrier layer may be modulated by altering the surface of the metal on which the barrier layer is deposited, by exposing the metal surface to a reducing agent. In one embodiment, the structure may be subjected to a low temperature annealing process using a reducing agent. The preferred reducing agents may be a hydrogen ($H_2$) gas atmosphere or an ammonia plasma.

In one example, the reducing process may include introducing the reducing agent, such as ammonia, into a vacuum chamber and initiating a plasma where the plasma excites the ammonia into an energized ionic state. The energized ions chemically react with the surface of the metallization layer.

In another example, the reducing process may also be performed by introducing a hydrogen containing plasma to the metal surface containing the oxidized portions. The hydrogen containing plasma chemically reacts with the oxidized metal surface to remove the oxidation and restore the metal surface portion to its original conductive characteristics.

Alternatively or additionally, the dielectric surface is silylated to form a silylated region on its surface by exposing the dielectric surface to a reactive silane. In a preferred embodiment, the reactive silane includes, but is not limited to, methyltriacetoxysilane, ethyltriacetoxysilane, propyltriacetoxysilane, dimethyldiacetoxysilane, methyltrichlorosilane, dimethyldichlorosilane, bis(dimethylamino)dimethylsilane, hexamethyl disilazane (HMDS), hexamethyl cyclotrisilazane, trimethylchlorosilane (TMCS), vinyltriethoxysilane (VTEO), tetrakis(methylethylketoximino)silane, N,O-bis(trimethylsilyl)acetamide. N,O-bis(trimethylsilyl)trifluoroacetamide and the like. The reactive silane may preferably be supplied as a gas in a dry silylation method, although a wet chemistry may also be employed. Dry chemistries provide a more uniform and controlled silylation process. In a preferred embodiment, a non-halogen reactive silane may be employed such that no halide is released as a by-product that would interfere with the fabrication equipment used. A process for silylation and a theoretical treatment thereof are described in U.S. Pat. No. 6,919,636, the entire contents of which are incorporated herein by reference.

In one embodiment, the structure, including the dielectric surface is exposed to reducing agent and then the barrier layer is deposited. In one example, the plasma process parameters to reduce copper oxide, include a pressure range of about 1 to about 9 mTorr, an RF power of about 100 to about 1000 watts to a chamber, that may have a reaction zone, to create the plasma having a power density of about 1.43 to about 14.3 watts/cm$^2$, a metal surface temperature of about 100° to about 450° C. and a reducing agent, such as ammonia or hydrogen gas, flowing at a rate of about 100 to about 1000 sccm into the chamber. Subsequently, the barrier layer is deposited by using processes well known in the art, such as atomic layer deposition (ALD).

In an alternative or additional embodiment, the structure, including the dielectric layer is exposed to reducing agent and silylating agent and then the barrier layer is deposited. The exposure to reducing agent and silylating agent may be practiced in sequence with the reducing agent followed by silylation or by silylation followed by reduction.

An embodiment of a method in accordance with the present invention is illustrated in the following FIGS. 1 through 3, wherein similar features are denoted by similar reference characters. Referring to FIG. 1, an underlying conductive feature is disposed in a first dielectric layer 140 overlying a substrate (not shown). The present embodiment in the FIG. 1 further includes recessed feature 110 having two sidewalls and a floor, within a second dielectric layer 130, where the second dielectric layer 130 may be deposited over the first dielectric layer 140 with the recessed feature 110 providing access to the conductive feature 120. In certain embodiments, the dielectric layer 130, in order to reduce parasitic capacitance, is a low-k dielectric material or an ultra low-k dielectric material (relative to the dielectric constant of silicon dioxide) and may be formed by any appropriate deposition process, such as a spin-on process, a chemical vapor deposition (CVD) or a thermally activated CVD process and the like. In this regard, low-k dielectric material may typically have a dielectric constant that is lower than 3.9, while the ultra low-k dielectric material may typically have a dielectric constant that is lower than 2.5. Suitable dielectric materials may include, dielectric materials having a porosity of 1% to 70%, such as porous SiLK™ (available from Dow Chemical, Midland, Mich.), and JSR 5108 or JSR 5109 or LKD (available from JSR), BLACK DIAMOND or BLACK DIAMOND II (available from Applied Materials), CORAL (available from Novellus). In an alternate embodiment, several mesoporous organosilicate glass (OSG) materials may also be employed as dielectric materials. The conductive feature 120 is commonly a metal such as copper or a copper alloy.

Figure 2:
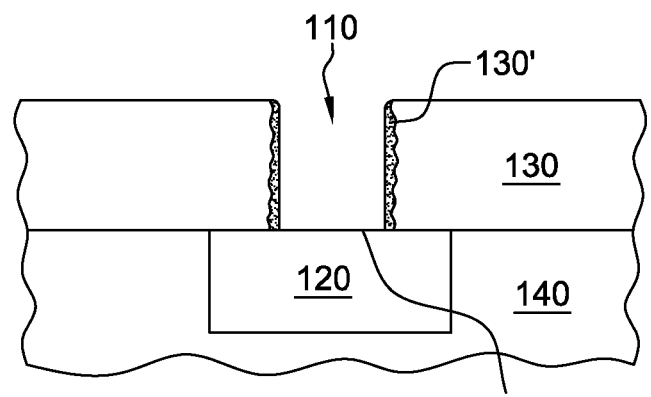
FIG. 2 depicts an intermediate structure of FIG. 1 after annealed conductive feature and an optional silylated dielectric layer, in accordance with one or more aspects of the present invention.

FIG. 2 illustrates the process of exposing the conductive feature 120 underlying the floor 120' of the recessed feature 110 to a low temperature annealing process using a reducing agent. The optional step of silylating the sidewalls of the dielectric layer 130 to form a silylated region 130' on its surface, is also shown in this figure.

Figure 3:
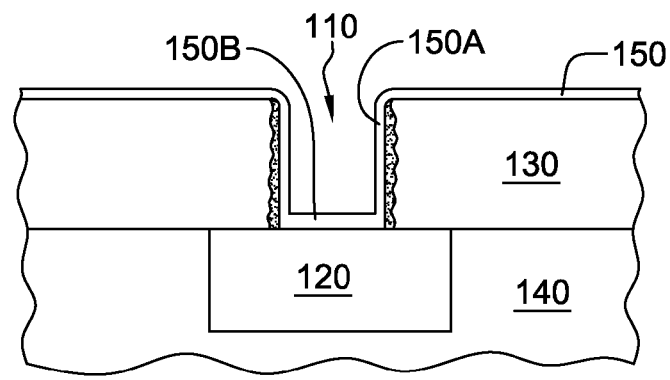
FIG. 3 depicts the resultant structure of FIG. 2 after the deposition of barrier layer, in accordance with one or more aspects of the present invention.

Subsequently, FIG. 3 illustrates the resultant structure obtained after a barrier layer 150 is deposited. In accordance with the embodiments of the present invention, the thickness of the barrier layer 150 has been modulated by the surface treatment of the sidewalls and the floor of the recessed feature 110 to provide a barrier layer with thinner sidewalls 150A and the thicker floor 150B on the recessed features.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A process comprising:
   providing a substrate having both an exposed dielectric surface and an exposed metal surface;
   exposing both said metal surface to a reducing agent and said dielectric surface to a reactive silane; and
   depositing a barrier layer over said exposed metal surface and said exposed dielectric surface;
   wherein the thickness of said barrier layer is the same or greater over said metal surface than over said dielectric surface.

2. The process according to claim 1, wherein said metal surface is exposed to a reducing agent and said dielectric surface is subsequently exposed to a reactive silane.

3. The process according to claim 1, wherein dielectric surface is exposed to a reactive silane and said metal surface is subsequently exposed to a reducing agent.

4. The process according to claim 1, wherein said reducing agent is chosen from $H_2$ and $NH_3$.

5. The process according to claim 1 wherein said reactive silane is of formula $R^1R^2R^3SiX$ wherein $R^1$, $R^2$ and $R^3$ are chosen independently from $C_1$-$C_8$ hydrocarbons and X is chosen from halogen, $OCH_3$, OEt, —N=N—, —O—C($CH_3$)=N— and —O—C($CF_3$)=N—.

6. The process according to claim 1, wherein said barrier layer is conformally deposited in a trench having an exposed dielectric sidewall and an exposed metal floor.

7. The process according to claim 6, wherein said barrier layer is chosen from Ta, TaN, Ru, RuN, Co, MnN, TiN and combinations thereof.

8. The process according to claim 7, wherein said barrier layer is deposited by atomic layer deposition (ALD).

9. The process according to claim 1, wherein said metal surface is a surface of a metal chosen from copper and an alloy of copper.

10. The process according to claim 1, wherein said dielectric surface having an exposed surface is chosen from an organosilicate and a porous silica.

11. The process according to claim 10, wherein said dielectric surface having an exposed surface is chosen from an organosilicate and a porous silica, said metal surface is copper, said reducing agent is hydrogen or ammonia, said reactive silane is hexamethyldisilazane, and said barrier layer is tantalum.

* * * * *